(12) United States Patent
Horio

(10) Patent No.: US 8,735,195 B2
(45) Date of Patent: *May 27, 2014

(54) METHOD OF MANUFACTURING A ZINC OXIDE (ZNO) BASED SEMICONDUCTOR DEVICE INCLUDING PERFORMING A HEAT TREATMENT OF A CONTACT METAL LAYER ON A P-TYPE ZNO SEMICONDUCTOR LAYER IN A REDUCTIVE GAS ATMOSPHERE

(75) Inventor: Naochika Horio, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 329 days.

This patent is subject to a terminal disclaimer.

(21) Appl. No.: 12/756,278

(22) Filed: Apr. 8, 2010

(65) Prior Publication Data

US 2010/0258795 A1 Oct. 14, 2010

(30) Foreign Application Priority Data

Apr. 10, 2009 (JP) ................................. 2009-096486

(51) Int. Cl.
*H01L 33/28* (2010.01)
*H01L 33/36* (2010.01)
*H01L 33/38* (2010.01)
*H01L 33/42* (2010.01)

(52) U.S. Cl.
CPC .............. *H01L 33/28* (2013.01); *H01L 33/36* (2013.01); *H01L 33/38* (2013.01); *H01L 33/42* (2013.01)
USPC ............. 438/46; 438/602; 438/609; 438/612; 438/644; 257/E33.064

(58) Field of Classification Search
USPC ........... 438/46, 597, 602, 612, 642, 644, 609; 257/E33.064
See application file for complete search history.

(56) References Cited

U.S. PATENT DOCUMENTS

| | | | |
|---|---|---|---|
| 5,990,500 A | 11/1999 | Okazaki | |
| 6,635,903 B2 * | 10/2003 | Kato et al. | 257/98 |
| 7,462,877 B2 * | 12/2008 | Song et al. | 257/98 |
| 2004/0051109 A1 * | 3/2004 | Ishizaki et al. | 257/89 |

(Continued)

FOREIGN PATENT DOCUMENTS

| | | |
|---|---|---|
| JP | 2001-168392 A | 6/2001 |
| JP | 2003-110142 A | 4/2003 |

(Continued)

OTHER PUBLICATIONS

Japanese Office Action dated Nov. 22, 2013, which issued in Japanese Patent Application No. 2009-096486.

*Primary Examiner* — Anh Mai
(74) *Attorney, Agent, or Firm* — Holtz Holtz Goodman & Chick PC

(57) ABSTRACT

Disclosed is a method of manufacturing a ZnO-based semiconductor device having at least p-type ZnO-based semiconductor layer, which includes a step of forming a contact metal layer on the p-type ZnO-based semiconductor layer wherein the contact metal layer contains at least one of Ni and Cu; and a step of performing heat treatment of the contact metal layer and the p-type ZnO-based semiconductor layer under an oxygen-free atmosphere to form a mixture layer including elements of the p-type ZnO-based semiconductor layer and the contact metal layer at a boundary region therebetween while maintaining a metal phase layer on a surface of the contact metal layer.

16 Claims, 13 Drawing Sheets

(56) References Cited

U.S. PATENT DOCUMENTS

2010/0258796 A1* 10/2010 Horio et al. .................... 257/43
2012/0097922 A1* 4/2012 Masuya et al. ................. 257/13
2012/0138999 A1* 6/2012 Okabe et al. ................... 257/98

FOREIGN PATENT DOCUMENTS

| JP | 2004-207440 A | | 7/2004 | |
| JP | 2004-214434 A | | 7/2004 | |
| JP | 2008-273814 | * | 11/2008 | ............ H01L 21/203 |
| JP | 2009-065050 | * | 3/2009 | .............. H01L 33/00 |

* cited by examiner

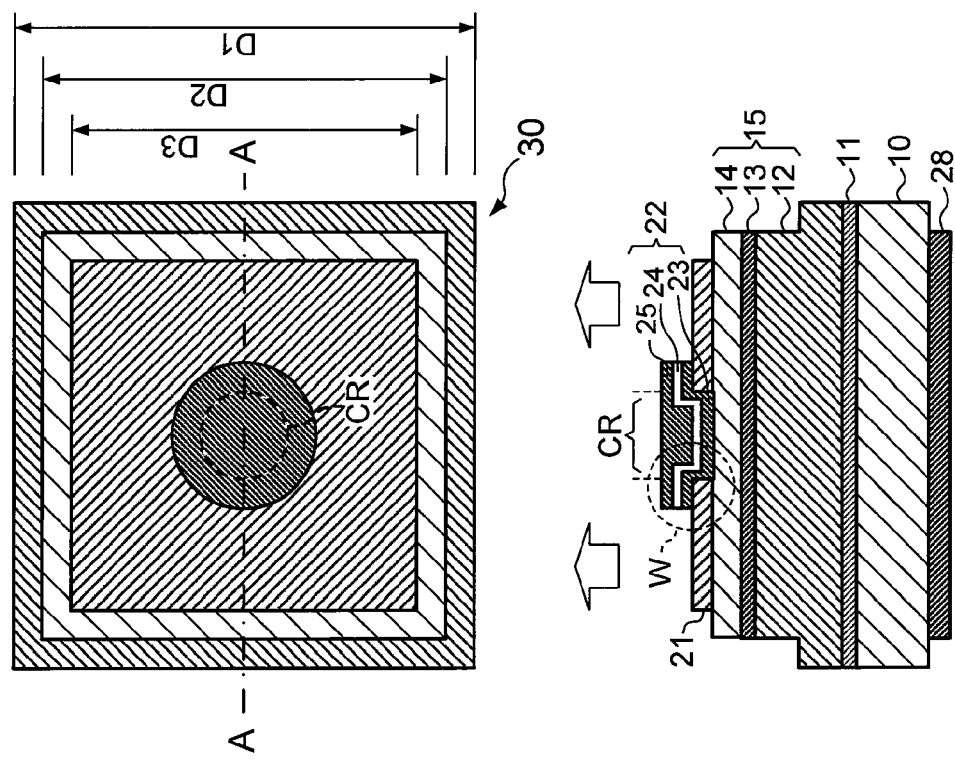

FIG.5

| | THRESHOLD VOLTAGE (V) | | PEELING OF ELECTRODE (Y: WIRE BONDING YIELD) | |
|---|---|---|---|---|
| | WITHOUT HEATING OF DEVICE | WITH HEATING OF DEVICE | WITHOUT HEATING OF DEVICE | WITH HEATING OF DEVICE |
| FIRST EMBODIMENT | LOW 3.5 - 3.9V | LOW (NO CHANGE) 3.5-3.9V | NO PEELING (Y > 95%) | NO PEELING (Y > 95%) |
| COMPARATIVE EXAMPLE 1 | HIGH 4.2-5.3V | UNSTABLE (PEELING) APPROX. 5.8V, OPEN | PEELING (Y=30 - 70%) | PEELING (NATURAL PEELING) (Y=5-10%) |
| COMPARATIVE EXAMPLE 2 | HIGH DISPERSION 3.6-4.8V | UNSTABLE (PEELING) APPROX. 5.5V, OPEN | PEELING (Y=20 - 60%) | PEELING (NATURAL PEELING) (Y=0%) |

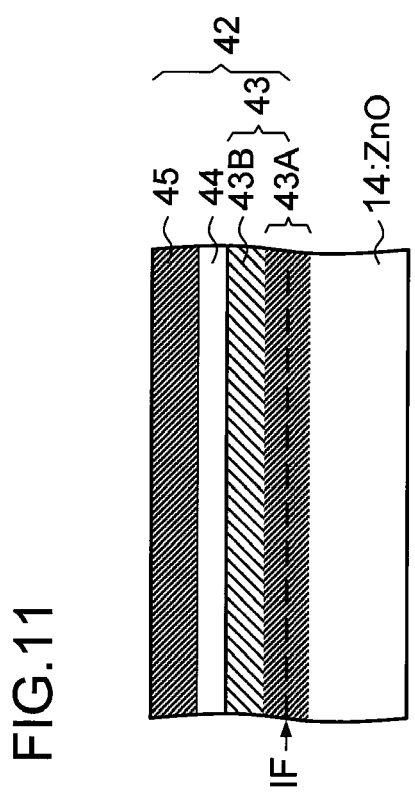

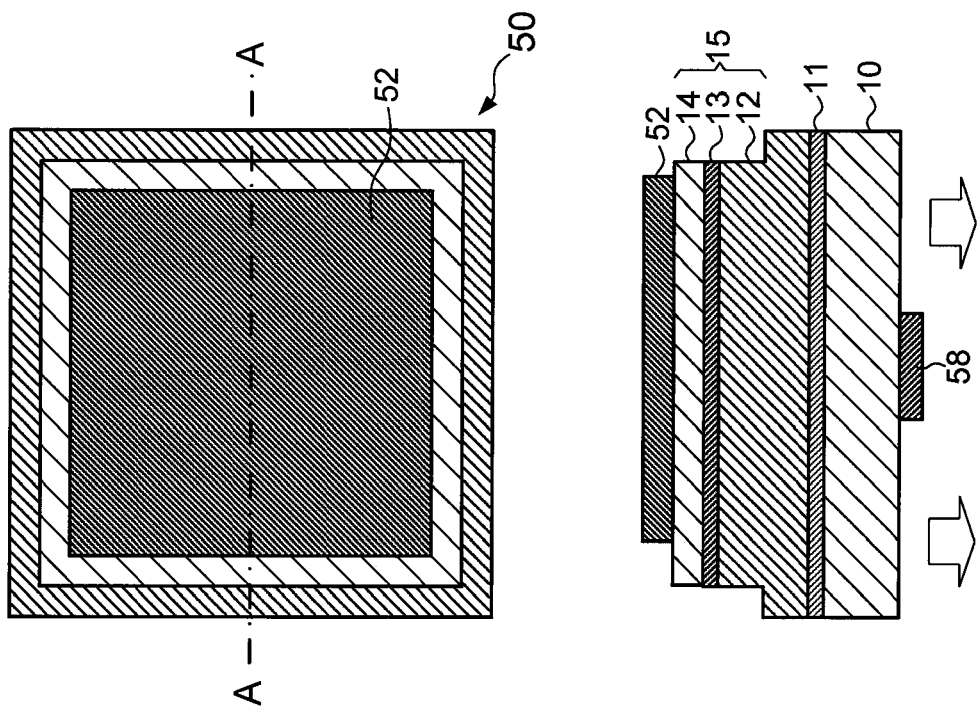

METHOD OF MANUFACTURING A ZINC OXIDE (ZNO) BASED SEMICONDUCTOR DEVICE INCLUDING PERFORMING A HEAT TREATMENT OF A CONTACT METAL LAYER ON A P-TYPE ZNO SEMICONDUCTOR LAYER IN A REDUCTIVE GAS ATMOSPHERE

BACKGROUND OF THE INVENTION

1. Field of the Invention

The present invention relates to a method of manufacturing a zinc oxide (ZnO) based (hereinafter, also referred to as 'ZnO-based') semiconductor device and, more particularly, to a ZnO-based compound semiconductor device having a contact electrode with high adhesion properties and good ohmic contact characteristics, as well as a method of manufacturing the same.

2. Description of the Related Art

ZnO is a direct transition type semiconductor having a band-gap energy of 3.37 eV at room temperature and is expected to be used as a material for a photoelectric device of a wavelength range from blue to ultraviolet. In particular, ZnO has the physical properties extremely suitable for a semiconductor light emitting device wherein an exciton binding energy is 60 meV and a refractive index is 2.0 (n=2.0). In addition, ZnO is not limitedly used in such light emitting diodes and/or light receiving diodes, but, may be employed in a wide range of devices including surface-acoustic wave (SAW) devices, piezoelectric devices, and the like. Moreover, ZnO as a raw material has the advantages that it is economical and is not harmful to the environment and human body.

It is well known that metal is poorly adhered to an oxide crystal and easily peels off or is easily separated therefrom. In particular, semiconductors not containing oxygen (for example, AlGaAs, InAlGaP, InAlGaP, InGaN, etc.) do not have significant problems in terms of attachment and/or adhesion to an electrode metal. However, a ZnO semiconductor, which is a metal oxide, exhibits poor adhesion to metal materials such as gold (Au), silver (Ag), rhodium (Rh), platinum (Pt), palladium (Pd), etc. Therefore, a process for manufacturing a p-electrode had a problem in that a metal electrode formed on a ZnO film often peels off or is separated therefrom. See, Japanese Laid-Open Patent Application No. 2003-110142 (hereinafter, also referred to as Patent Document 1) and Japanese Laid-Open Patent Application No. 2004-207440 (hereinafter, also referred to as Patent Document 2).

Furthermore, when heat treatment (e.g., alloying, sintering) is conducted after formation of an electrode in order to decrease contact resistance between a p-type ZnO layer and the electrode (i.e., to improve ohmic contact properties), there is a problem that peeling or separation of the electrode becomes pronounced. As such, with respect to an electrode of semiconductor device such as a semiconductor light emitting device, various manufacturing processes including, for example, heat treatment to decrease contact resistance, or die-bonding, wire-bonding, resin sealing, and the like entail heat stress and/or external stress. In addition, various types of stresses may be applied to the device after the manufacturing process. For instance, a device sealing process or a process of bonding the device to a circuit board may include application of heat stress thereto. The sealing process may also entail mechanical stress caused by sealing resin. Furthermore, heat or strain force may cause various stresses during use of a semiconductor device. For example, a semiconductor light emitting device used in an automobile may be subjected to various kinds of stresses including, heat and/or strain force, wherein such stresses are generated by car temperature, engine temperature, heat-shock due to diurnal and/or seasonal variation in temperature, exposure to solar UV radiation, car corrosion caused by water content and/or ambient gas (such as sulfate, chlorine, ozone), and so forth. Accordingly, it is very important to fabricate an electrode with excellent peeling-resistance capability independent of various stresses, thus ensuring high device performance, production yield and reliability.

Since ZnO-based compounds are wide band-gap semiconductors, metal materials having excellent ohmic characteristics which can be used as p-electrodes are limited. Therefore, there is still a strong demand for a metal electrode with high adhesion as well as excellent low-resistance ohmic-contact properties in order to provide manufacturing of improved ZnO-based semiconductor devices.

SUMMARY OF THE INVENTION

However, with respect to ZnO-based compound semiconductor crystals, considerable research and investigation into fabrication of a contact electrode having excellent ohmic contact and excellent adhesion properties has not been conducted.

The present invention is directed to provide a method for forming a contact electrode having excellent ohmic contact properties as well as excellent adhesion properties without causing peeling of an electrode of a p-type ZnO-based compound semiconductor, a ZnO-based compound semiconductor device having the contact electrode described above, and a process for manufacturing the semiconductor device. The present invention also provides a ZnO-based compound semiconductor device with high performance, production yield and/or reliability while maintaining high adhesion, and device performances, independent of various stresses caused by stress due to heat or strain during manufacturing processes or environments of using the device and, in addition, a process for manufacturing the same.

According to the present invention, there is provided a method of manufacturing a zinc oxide (ZnO) based semiconductor device having at least p-type ZnO-based semiconductor layer, which includes a contact metal layer formation step of forming a contact metal layer on the p-type ZnO-based semiconductor layer wherein the contact metal layer contains at least one of nickel (Ni) and copper (Cu); and a heat treatment step of performing heat treatment of the contact metal layer and the p-type ZnO-based semiconductor layer under an oxygen-free atmosphere to form a mixture layer comprising elements of the p-type ZnO-based semiconductor layer and the contact metal layer at a boundary region between the p-type ZnO-based semiconductor layer and the contact metal layer while maintaining a metal phase layer on a surface of the contact metal layer.

After the heat treatment step, a barrier metal layer and a pad metal layer may be further formed on the contact metal layer.

Further, according to the present invention, there is provided a ZnO-based semiconductor device having at least p-type ZnO-based semiconductor layer, which includes a contact electrode layer formed on the p-type ZnO-based semiconductor layer, the contact electrode layer including at least one of Ni and Cu; and a pad electrode formed on the contact electrode layer, wherein the contact electrode layer includes a metal phase layer formed on a surface of the contact electrode layer and a mixture layer comprising elements of the p-type ZnO-based semiconductor layer and the contact electrode layer, the mixture layer being formed at a boundary region between the p-type ZnO-based semiconductor layer and the contact electrode layer.

Still further, the present invention provides a method for forming a contact electrode for a p-type ZnO-based semiconductor, which includes a step of forming a contact metal layer on the p-type ZnO-based semiconductor, the contact metal layer comprising at least one of Ni and Cu; and a step of performing heat treatment of the p-type semiconductor having the contact metal layer formed thereon under an oxygen-free atmosphere, to form a mixture region including elements of the p-type ZnO-based semiconductor layer and the contact metal layer at a boundary between the p-type ZnO-based semiconductor layer and the contact metal layer while maintaining a metal phase layer on a surface of the contact metal layer.

The oxygen-free atmosphere described above may be any one of vacuum, an inert gas atmosphere, a reductive gas atmosphere and a mixture of an inert gas and a reductive gas.

The heat treatment described above may be conducted at a temperature in the range of 350 to 450° C.

BRIEF DESCRIPTION OF THE DRAWINGS

FIGS. 4A and 4B are a top view and a cross-sectional view taken along the line A-A of the top view, showing a fabricated LED device;

FIG. 5 illustrates evaluation results of threshold voltage of V-I characteristics and peeling of a p-electrode of an LED according to a first embodiment of the present invention, compared to those of LEDs fabricated in Comparative Examples 1 and 2;

FIG. 11 is an enlarged cross-sectional view schematically showing a configuration of a p-electrode in the LED device fabricated according to the second embodiment;

FIGS. 12A and 12B are a top view and a cross-sectional view taken along the line A-A in the top view, showing an LED device according to a third embodiment of the present invention.

DETAILED DESCRIPTION OF THE INVENTION

Hereinafter, preferred embodiments of a process for forming a metal electrode on a semiconductor crystal laminate or layered structure which is formed by laminating or stacking crystal layers comprising a ZnO-based compound semiconductor on a ZnO substrate and, in addition, a process for manufacturing a semiconductor device having an electrode formed therein will be described in detail with reference to the accompanying drawings. The following description will be made for growing layers to complete the above-described semiconductor crystal layered structure (i.e., multi-layer structure) used for manufacturing an LED (Light Emitting Diode) device as an example.

First Embodiment

Figure 1:
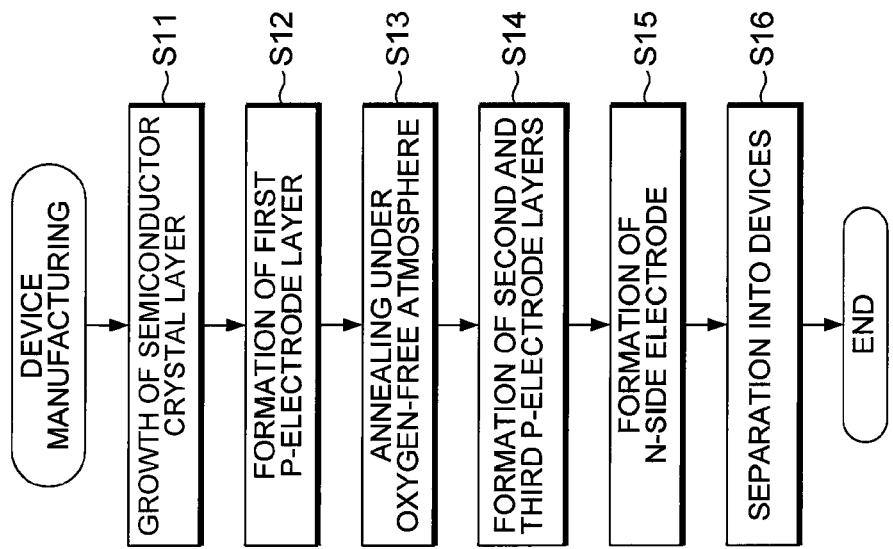
FIG. 1 is a flow chart illustrating a sequential order of a process for manufacturing a semiconductor device according to the present invention.
Figure 2:
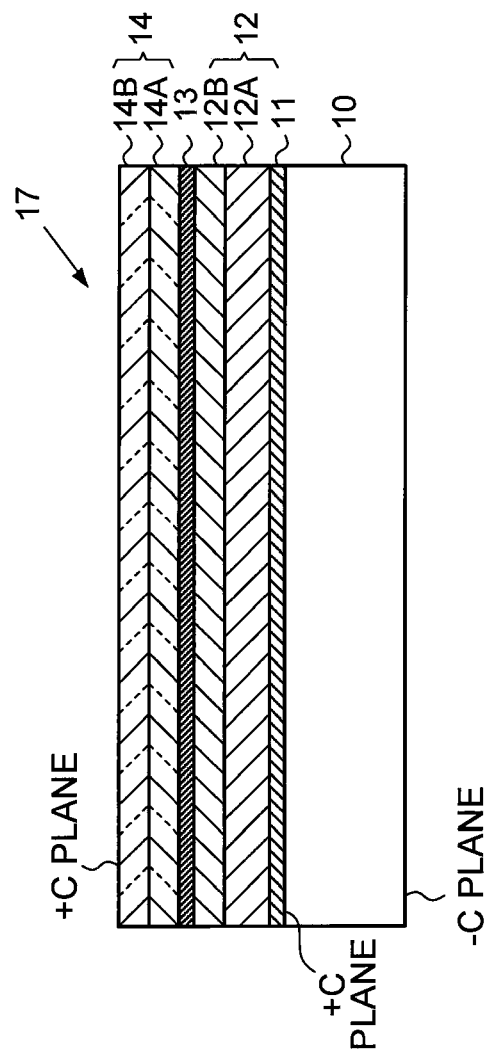
FIG. 2 is a cross-sectional view showing an LED device-layer-formed substrate fabricated by depositing a ZnO-based compound semiconductor layer on a ZnO substrate.

With reference to a flow chart shown in FIG. 1, a method of manufacturing an LED device according to the present invention is described in detail. FIG. 2 is a cross-sectional view showing an LED device-layer-formed substrate 17 fabricated by growing a ZnO-based compound semiconductor layer on a ZnO substrate 10.

Using a radical source-molecular beam epitaxy (RS-MBE) apparatus, ZnO-based compound semiconductor crystal layers were sequentially formed on a substrate 10 (FIG. 1, Step S11). In the RS-MBE, metal materials, that is, zinc (Zn), magnesium (Mg) and gallium (Ga) were evaporated or effused and provided over the substrate 10 using a Knudsen cell. As a gas source, oxygen O and nitrogen N were supplied in oxygen radical (represented by O*) and nitrogen radical (represented by N*). The substrate 10 was heated using an electric resistance heater.

The substrate 10 comprises ZnO single crystal having a {0001} plane of a Wurtzite structure as a main surface, and having a thickness of 500 μm, for example. More particularly, ZnO-based crystal layers were grown on a substrate 10 having a Zn polar plane (+c plane) as a crystal growth plane.

As shown in FIG. 2, a buffer layer 11 which is a ZnO layer having a thickness of 30 nm was firstly grown on the +c plane of the ZnO substrate. Here, the buffer layer 11 was a low-temperature grown buffer layer and a growth temperature Tg was 300° C. After growing the buffer layer 11, heat treatment (annealing) was conducted at a temperature T of 900° C. for 5 minutes.

Following this, a first n-type ZnO-based crystal layer 12A and a second n-type ZnO-based crystal layer 12B were grown in this order on the buffer layer 11 at a growth temperature Tg of 900° C. The first n-type ZnO-based crystal layer 12A was a ZnO layer having a thickness of 300 nm and a gallium (Ga) concentration of $3 \times 10^{18}$ cm$^{-3}$, while the second n-type ZnO-based crystal layer 12B was an $Mg_{0.2}Zn_{0.8}O$ layer having a thickness of 50 nm and a Ga concentration of $3 \times 10^{18}$ cm$^{-3}$.

On the second n-type ZnO-based crystal layer 12B, a light emitting layer 13 was grown at a growth temperature Tg of 900° C. The light emitting layer 13 was an undoped ZnO layer having a thickness of 30 nm.

Next, a first p-type ZnO-based crystal layer 14A and a second p-type ZnO-based crystal layer 14B were grown in this order on the light emitting layer 13 at a growth temperature Tg of 700° C. The first p-type ZnO-based crystal layer 14A was an $Mg_{0.2}Zn_{0.8}O$ layer having a thickness of 30 nm and a nitrogen (N) concentration of $1 \times 10^{20}$ cm$^{-3}$, while the second p-type ZnO-based crystal layer 14B was a ZnO layer having a thickness of 100 nm and a nitrogen concentration of $1 \times 10^{20}$ cm$^{-3}$.

Based on the forgoing description, hereinafter, a layer comprising the first n-type ZnO-based crystal layer 12A and the second n-type ZnO crystal layer 12B is referred to as an n-type ZnO-based crystal layer 12 and a layer comprising the first p-type ZnO-based crystal layer 14A and the second p-type ZnO crystal layer 14B is referred to as a p-type ZnO-based crystal layer 14. A layered structure comprising the n-type ZnO-based crystal layer 12, the light emitting layer 13 and the p-type ZnO-based crystal layer 14 is also referred to as a device layer (LED layer) 15. Although the present embodiment describes the n-type ZnO-based crystal layer 12 and the p-type ZnO-based crystal layer 14, each of which comprises multiple crystal layers with different constitutional compositions and different thicknesses, each of the n-type ZnO-based crystal layer and the p-type ZnO-based crystal layer may be a single layer. As such, the device layer 15 (i.e., LED device layer) comprising the n-type ZnO-based crystal layer 12, the light emitting layer 13 and the p-type ZnO-based crystal layer 13 was formed (FIG. 1, Step S11).

The device layer herein means a layer (or multi-layer) formed of semiconductor required for a semiconductor device in order to accomplish desired performance thereof. For example, a simple transistor may have a structural layer comprising an n-type semiconductor, a p-type semiconductor and another n-type semiconductor (or, a p-type semiconductor, an n-type semiconductor and another p-type semiconductor) having pn junctions.

A semiconductor structural layer comprising a p-type semiconductor layer, a light emitting layer and an n-type semiconductor layer (or, a p-type semiconductor layer and an n-type semiconductor layer), wherein light emitting behavior of the structural layer is embodied by recombination of carriers injected thereinto, is especially called 'light emitting device layer.' In addition, for an LED, the foregoing semiconductor layer may be referred to as an 'LED device layer.'

A crystal growing process is not limited to RS-MBE. That is, other crystal growing methods such as metal organic chemical vapor deposition (MOCVD), pulse laser deposition (PLD), etc. may also be used.

Configurations of the buffer layer 11, the n-type ZnO-based crystal layer 12, the light emitting layer 13 and the p-type ZnO-based crystal layer 14, or configurations of the first n-type ZnO-based crystal layer 12A and the second n-type ZnO-based crystal layer 12B, and the first p-type ZnO-based crystal layer 14A and the second p-type ZnO-based crystal layer 14B, that is, crystal composition, thickness, dopant concentration, etc. of each of the foregoing layers may be suitably defined or modified according to a device structure. For example, the buffer layer 11 may be an n-type $Mg_xZn_{(1-x)}O$ layer (wherein $0 \leq x < 0.43$) comprising a ZnO-based crystal containing Mg. The buffer layer 11 may be, for example, an n-type $Mg_xZn_{(1-x)}O$ layer (wherein $0 \leq x < 0.43$) that is several nanometers (nm) to several micrometers (μm) thick and is doped with impurities (e.g., Ga). Additionally, the n-type ZnO-based crystal layer 12 may be an n-type $Mg_xZn_{(1-x)}O$ layer ($0 \leq x < 0.43$) that has a thickness of several tens of nanometers to several micrometers and is doped with impurities (e.g., Ga) at a doping concentration of $1 \times 10^{17}$ cm$^{-3}$ to $5 \times 10^{18}$ cm$^{-3}$. On the other hand, the light emitting layer 14B may include a configuration of a single quantum well (SQW) structure that consists of a quantum well and a barrier layer each having a thickness of several nanometers, for example, a multiple quantum well (MQW) structure having multiple quantum wells and barrier layers, or an $Mg_xZn_{(1-x)}O$ layer (wherein $0 \leq x < 0.43$) with a single constitutional composition.

The p-type ZnO-based crystal layer 14 may be a p-type $Mg_xZn_{(1-x)}O$ layer (wherein $0 \leq x < 0.43$). For example, the p-type ZnO-based crystal layer 14 may be a p-type $Mg_xZn_{(1-x)}O$ layer ($0 \leq x < 0.43$) that has a thickness of several tens of nanometers to several micrometers and is doped with nitrogen (N) at a doping concentration of $1 \times 10^{20}$ cm$^{-3}$.

Constitutional compositions, thicknesses and dopant concentrations of the foregoing layers described above are for illustrative purposes and may be suitably selected and/or modified to achieve desired device characteristics.

[Configuration and Formation of P-Side Electrode]

Hereinafter, a ZnO-based compound semiconductor device (LED) is fabricated using a substrate 17 having the LED device layer formed as described above (simply referred to as 'device-layer-formed substrate'). FIGS. 3A to 3D are cross-sectional views schematically showing an LED device fabrication process. FIGS. 4A and 4B are a top view and a cross-sectional view taken along the line A-A of the top view, respectively, showing a fabricated LED device 30.

First, a p-side electrode was formed on the p-type ZnO-based crystal layer 14 of the device-layer-formed substrate 17. More specifically, using photographic techniques, a resist mask having an opening in a form of a light transmissive conductive electrode (herein, referred to as transparent electrode) 21 (FIG. 4A, see the top view) was formed. In more detail, resist patterning was performed such that the transparent electrode 21 was formed in a rectangular shape with a circular contact region CR having a diameter of 100 μm in the center of the transparent electrode 21, thus allowing ohmic contact of a p-side electrode 22 (described below) and the p-type ZnO-based crystal layer 14. According to the embodiment of the present invention, the transparent electrode 21 was formed in a square shape having sides of 270 μm (D3), which is about 15 μm smaller than a size of a square device partition having sides of D2 (300 μm) (FIG. 4). In addition, the device was formed to have a square form having sides of 400 μm (D1), and a thickness thereof was 200 μm as described below.

Figure 3A:
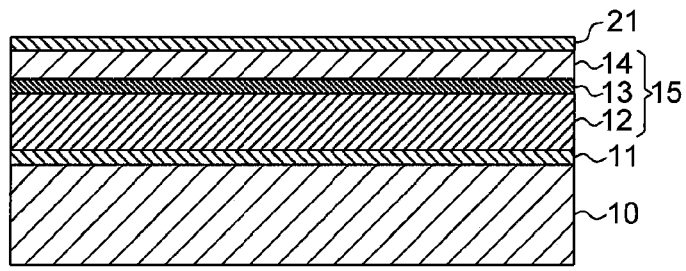
FIGS. 3A to 3D are cross-sectional views schematically showing a process of fabricating an LED device.
Figure 3B:
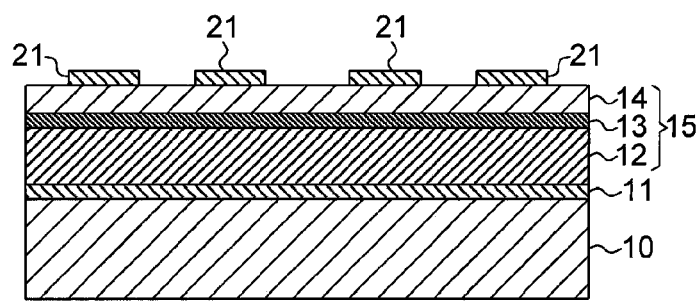

Next, Ni (Nickel) and Au (gold) were deposited in sequential order to thicknesses of 5 nm and 30 nm, respectively, by EB (Electron Beam) deposition so as to form a Ni/Au layer (FIG. 3A). The Ni/Au layer means a laminate comprising a Ni layer as a first layer and a Au layer as a second layer and are hereinafter described with the same meaning. By lift-off processing, other portions of the Ni/Au layer except for a mask opening portion were removed (FIG. 3B).

Subsequently, the Ni/Au layer was subjected to transparent treatment at 450° C. for 30 seconds, using a rapid thermal annealing (RTA) apparatus. Nitrogen gas containing 20% oxygen was used for the transparent treatment. By performing this process, Ni in the Ni/Au layers is oxidized to produce nickel oxides (NiO, $Ni_2O$), thus making the electrode 21 transmissive (i.e., transparent or translucent).

Figure 3C:
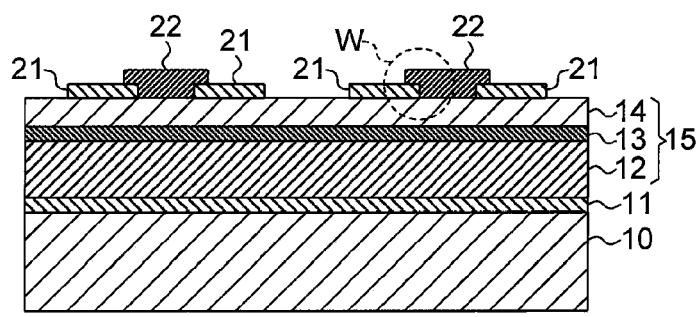

Then, a p-side electrode 22 comprising three electrode layers (hereinafter, referred to as p-electrode layers) was formed (FIG. 3C and FIG. 4B). Hereinafter, the p-electrode layers refer to first, second and third p-electrode layers 23, 24 and 25, respectively (FIGS. 7A to 7C), which are described in detail below.

Firstly, a metal mask having an opening to match a shape of the p-side electrode 22 (see FIG. 4A, a circular shape according to the present embodiment) was set in a metal mask cell. Then, the substrate was set such that the center of the transparent electrode 21 formed by the above-described process was in alignment with the center of an opening of the mask.

Then, Ni was deposited to a thickness of 30 nm by electron beam (EB) deposition wherein Ni is an electrode metal to form the first p-electrode layer 23 (i.e., contact electrode) (FIG. 1, Step S12).

Then, the metal mask cell carrying the substrate was set in an RTA apparatus and an $N_2$ gas mixture containing 3% hydrogen gas was introduced into the apparatus. Under a reductive atmosphere, heat treatment (annealing) was conducted at 400° C. for 10 seconds (FIG. 1, Step S13). As such, the first p-electrode layer 23 was formed.

Following this, the metal mask cell was set in an EB apparatus. Platinum (Pt) as a barrier metal and gold (Au) as a connection electrode (or pad electrode) metal were deposited to thicknesses of 100 nm and 1000 nm, respectively, so as to form the second p-electrode layer 24 and the third p-electrode layer 25 (FIG. 1, Step S14). As such, the p-side electrode 22 comprising the first, second, and third p-electrode layers 23, 24 and 25 was formed.

Figure 3D:
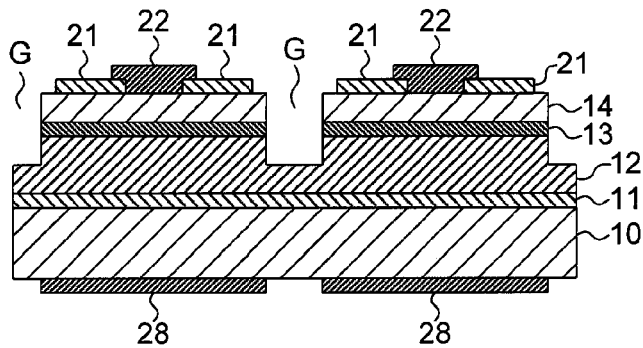

Using photolithography, a resist mask having an opening of a shape of the device partition (i.e., square with side lengths of D2, FIG. 4) was formed on a front side of the substrate having the p-side electrode 22 formed thereon. Performing wet etching, the n-type ZnO-based crystal layer 12 was etched to a depth to remove a portion thereof, so as to form a device partition groove G (FIG. 3D).

The device-layer-formed substrate 17 was bonded to a support body (hereinafter, simply referred to as support) such that the surface side of the substrate having the p-side electrode 22 formed thereon was in contact with the support, and a back side of the device-layer-formed substrate 17 was subjected to mirror polishing to a thickness of about 200 μm. Subsequently, photolithography and EB deposition were conducted to deposit Ti and Au to thicknesses of 100 nm/1000 nm (Ti/Au=100 nm/1000 nm), respectively, to the back side of the device-layer-formed substrate 17, thereby forming an n-side electrode 28 with the same shape as of the device partition (Step S15 in FIG. 1, FIG. 3D). Further, as an ohmic electrode metal layer of the n-side electrode 28, Tl/Rh/Au layers may be used. Thicknesses of the layers may be, for example: Ti/Rh/Au=3-30 nm/50-100 nm/500-1000 nm; or Ti/Rh/Au=10 nm/80 nm/1000 nm. Alternatively, Ti/Al/Au layers may be used as the n-side ohmic electrode metal layer. Thicknesses of the layers may be, for example: Ti/Al/Au=3-30 nm/50-100 nm/500-1000 nm; or Ti/Al/Au=10 nm/80 nm/1000 nm.

After completing formation of the n-side electrode 28, the device-layer-formed substrate 17 was subjected to scribing and breaking along the device partition groove G, so as to divide the substrate into separate LED devices (FIG. 1, Step S16). FIGS. 4A and 4B are a top view and a cross-sectional view showing an LED device fabricated as described above. Arrows in the figures indicate light emission direction.

[Evaluation of Electrical and Adhesion Properties]

With regard to an LED device fabricated according to the first embodiment as described above, electrical properties and adhesion properties of the LED device were evaluated and compared to those of LED devices for comparison (hereinafter, also referred to as "Comparative Examples") with the device of the invention. More particularly, for an LED according to the first embodiment and LEDs of Comparative Examples 1 and 2, ohmic characteristics based on threshold voltage of V-I characteristics were evaluated. Also, an adhesion strength of a p-side electrode was evaluated by monitoring whether the electrode peels off or not upon wire-bonding. Each of the LED devices of the first embodiment and the Comparative Examples 1 and 2 was subjected to heat treatment at 350° C. for 15 seconds under $N_2$ gas atmosphere, in consideration of heat history or cycle when mounting a device. After the heat treatment, the LED devices were evaluated according to the above-described procedures. For each of the first embodiment and Comparative Examples 1 and 2, 25 samples (i.e., LEDs) were selected and a total of 75 samples were evaluated.

Comparative Example 1 and Comparative Example 2

With respect to LEDs of Comparative Example 1, Ni and Au were used as a first p-electrode layer and a second p-electrode layer, respectively. EB deposition was conducted to deposit a Ni/Au layer to thicknesses of 30 nm/1000 nm, thereby forming a p-side electrode. Then, annealing of the first and second p-electrode layers were not performed. Except for a configuration of the p-electrode and a process for forming the same, the same procedures as descried in the first embodiment were used. Specifically, configurations of a semiconductor crystal layer, a transparent electrode and an n-side electrode and other processes for fabrication of devices are substantially the same as described in the first embodiment.

With respect to an LED of Comparative Example 2, Ni was used as a first p-electrode layer. That is, Ni was formed to a thickness of 30 nm by EB deposition. After deposition, annealing was performed using an RTA apparatus at 450° C. for 1 minute under an $N_2$ atmosphere containing 20% $O_2$ gas (an oxygen atmosphere or an oxidative gas atmosphere). More particularly, according to the annealing process, nickel oxides (NiO+$Ni_2O$) were formed as the first p-electrode layer including a surface portion thereof.

After annealing, Au as a second p-electrode layer was deposited to a thickness of 1000 nm by EB deposition, thus completing formation of a p-side electrode. In this case, the same procedures as described in the first embodiment were used except for a configuration of the p-side electrode and a process for formation thereof.

(Evaluation Results)

With respect to LEDs of the first embodiment and Comparative Examples 1 and 2, evaluation results of threshold voltages of V-I characteristics and peeling of a p-side electrode are summarized in FIG. 5. In consideration of heat history at the time of mounting a device after manufacture, for example, a heating process performed for device mounting such as a reflow soldering in die-bonding (at about a temperature of 230 to 270° C.) or Au/Sn bonding (at a temperature of 300 to 350° C.), the fabricated devices were subjected to heat treatment at 350° C. for 15 seconds. For the heat-treated devices, evaluation results of threshold voltage and electrode peeling are shown in the figure.

Figure 6:
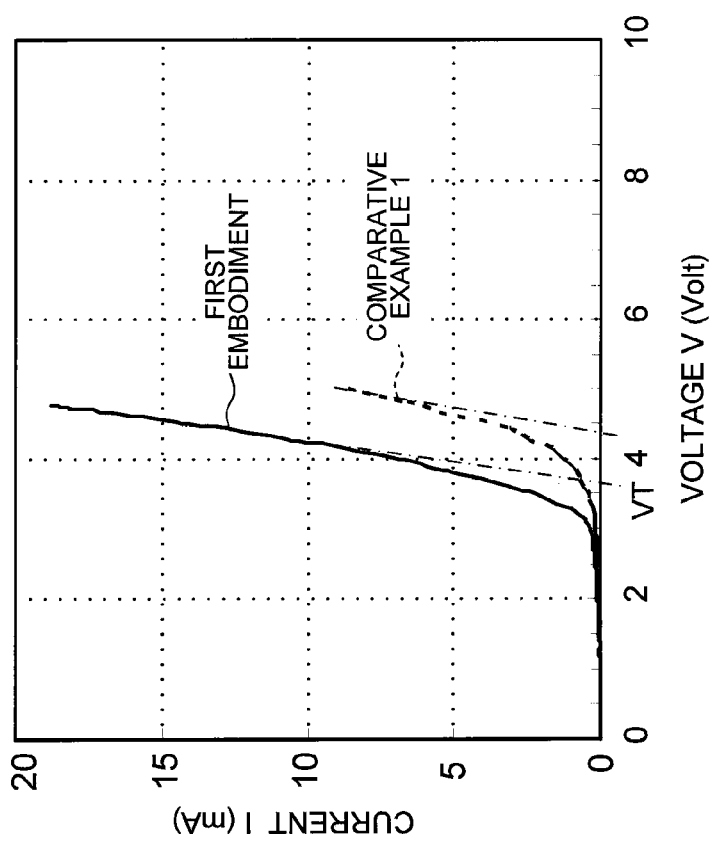
FIG. 6 is graphs showing an illustrative example of measured voltage-current characteristics of LEDs of the first embodiment of the present invention and the Comparative Example 1.

With respect to LEDs of the first embodiment and Comparative Example 1, voltage-current characteristics (V-I curve) of the LEDs were measured and illustrative examples thereof are shown in FIG. 6. It can be seen that the LED of the first embodiment has excellent diode characteristics and ohmic contact properties, since the V-I curve of the LED shows a steep rising edge and a threshold voltage (VT) is low. Referring to FIG. 5, VTs of the samples of the first embodiment are relatively low and in the range of 3.5 to 3.9V. It was found that the device shows stable characteristics without alteration thereof even after heating.

On the other hand, the threshold voltages of the samples of Comparative Example 1 were of high level of 4.2 to 5.3V and a statistical dispersion of the threshold voltages was also high. With regard to heat treatment of a device, there were quite a number of samples not evaluated due to electrode peeling (i.e., open state). Even for samples that could be evaluated, the threshold voltage VT was about 5.8V, which is considerably high. Like the samples of Comparative Example 1, samples of Comparative Example 2 also had a high VT of 3.6 to 4.8V and a high statistical dispersion of threshold voltages. After heat treatment of the devices, many samples could not be evaluated due to electrode peeling (i.e., in an open state).

For the purpose of evaluation of electrode adhesion properties, samples of the first embodiment, Comparative Example 1 and Comparative Example 2 were subjected to die-bonding to stems using an Ag paste, followed by Au wire-bonding. All of the samples of the first embodiment did not show electrode peeling and wire-bonding could be performed. Bonding failure was observed from some samples of the first embodiment, although such failure was caused by incorrect die-bonding position rather than problems in electrode adhesion. Wire-bonding was also suitably performed without problems even after heat treatment of the device.

For samples of Comparative Examples 1 and 2, electrode peeling occurred with considerable frequency during wire-bonding. Also, non-uniformity between sample lots was high and a wire-bonding yield was 60 to 70% for good samples and 20 to 30% for bad samples. After heat treatment, natural electrode peeling and electrode peeling during bonding were often observed and a wire-bonding yield was 5 to 10% at most.

Based on the above-described evaluation results, it was demonstrated that a configuration of an electrode and a process for manufacturing an electrode according to the first embodiment show excellent ohmic characteristics suitable for an electrode for ZnO-based semiconductor devices and have high adhesion properties and adhesion strength. In addition, it was found that the electrode according to the first embodiment maintains excellent characteristics during heat treatment after device manufacture, as well as excellent heat resistance.

[Analysis of Improvement in Ohmic Characteristics and Adhesion Properties]

Improvement in ohmic characteristics and adhesion properties of a p-side electrode according to the embodiments was examined and analyzed. A mechanism of improvement in such characteristics or properties will be described in detail with reference to the accompanying drawings.

Figure 7A:
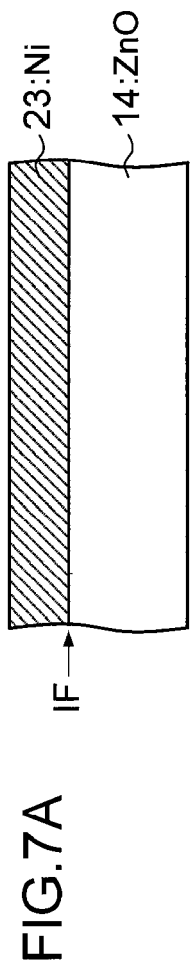
FIGS. 7A to 7C are schematic enlarged views of the contact portion, which illustrate effects of heat treatment conducted where electrode metal of a first p-electrode layer is formed on a ZnO-based crystal layer.
Figure 7B:
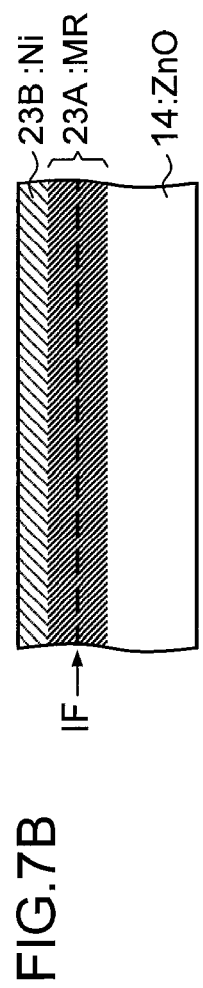
Figure 7C:
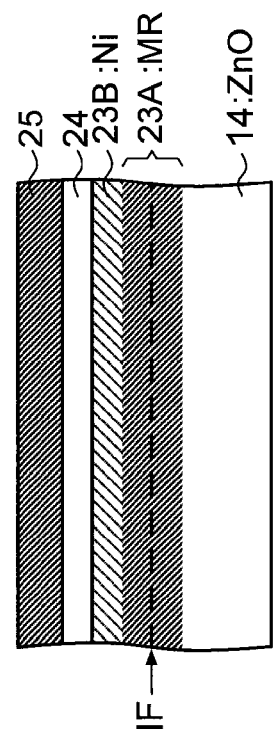

FIGS. 7A and 7B are enlarged views showing a p-type ZnO-based crystal layer 14 and a contact portion of an electrode metal in order to schematically illustrate effects of a process for forming the electrode metal of a first p-electrode layer 23 on the p-type ZnO-based crystal layer 14 and then heating (annealing) the layers. FIG. 7C is a cross-sectional view showing a process of forming a second p-electrode layer 24 and a third p-electrode layer 25 on the first p-electrode layer 23 after annealing.

According to the first embodiment as shown in FIG. 7A, in order to form the first p-electrode layer 23 (contact metal layer), Ni which is readily oxidized was used as the electrode metal and deposited on the p-type ZnO-based crystal layer 14 by vapor deposition. In other words, a contact electrode metal (Ni) layer is placed on and in contact with the p-type ZnO-based crystal layer 14 after deposition. Referring to the figure, a boundary or interface IF between the p-type ZnO-based crystal layer 14 and the Ni layer 23 is indicated by an arrow.

In the first embodiment, annealing was conducted under a reductive atmosphere (or oxygen-free ambient) after Ni deposition. It is considered, as shown in FIG. 7B, that a region 23A (hereinafter, referred to as 'mixture region MR') at which atoms contained in the p-type ZnO-based crystal layer and the Ni layer (the first p-electrode layer) were combined and/or mixed in various states was formed in the vicinity of the boundary IF between these layers by the annealing process. In addition, a pure metal layer (Ni layer) 23B remains on the portion other than the mixture region 23A (that is, a surface portion thereof). In other words, the contact electrode layer comprising the mixture region 23A and the pure metal layer is formed on the p-type ZnO-based crystal layer.

In more detail, oxygen (O) is provided only from a ZnO-based crystal (i.e., p-type ZnO-based crystal layer 14) during annealing under a reductive atmosphere (or, oxygen-free atmosphere or non-oxidative atmosphere). Accordingly, atoms present at the boundary are inter-diffused by annealing. The layer of readily oxidized metal (Ni) changes in the interior thereof continuously from a metal phase layer to an oxide phase layer, in accordance with an amount of oxygen diffused thereinto through the boundary. That is, an amphoteric layer capable of forming a metallic bond to metal and a covalent bond to oxide is formed. More particularly, oxygen atoms contained in the ZnO-based crystal move into Ni deposited on the crystal while movement of Ni atoms into the ZnO-based crystal is promoted. As a result, Zn, Ni and O are mixed and combined in various states to form the mixture region (or mixture layer) 23A at the boundary (IF) region.

Figure 8:
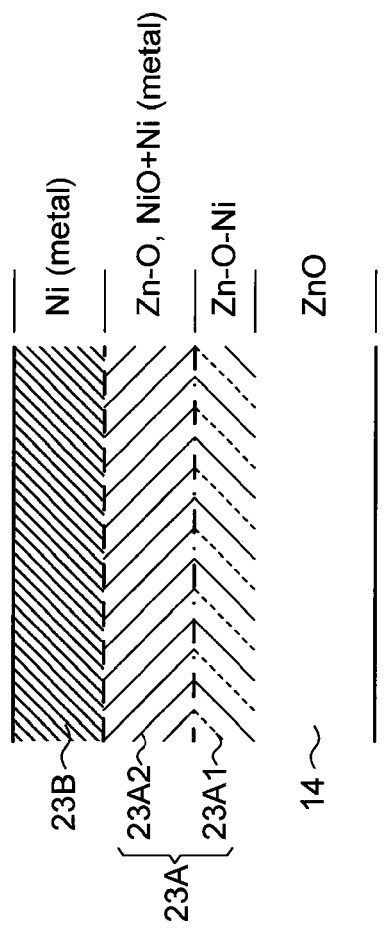
FIG. 8 is a partially enlarged view showing, in detail, a mixture region formed at a boundary between a ZnO-based crystal layer and a first p-electrode layer.

FIG. 8 is a partially enlarged view schematically illustrating the boundary region between the p-type ZnO-based crystal layer 14 and the Ni layer (the first p-electrode layer) 23. The following description will be given to explain, in detail, the mixture region 23A described above. Referring to FIG. 8, it is considered that the mixture region 23A has a configuration including: a mixture region 23A1 comprising a mixed crystal phase (Zn—O—Ni) layer of ZnO and NiO; and another mixture region 23A2 comprising a layer of ZnO, and NiO phase and Ni metal phase (NiO, $Ni_2O+Ni$ metal). A thickness of the mixture region 23A may range from several to less than twenty monolayers (i.e., atomic layers), in consideration of thickness of the deposited Ni layer. The regions are not clearly partitioned from one another, although they may have different states and/or thicknesses based on annealing conditions such as temperature.

Further, in another aspect of the present invention, the above-described boundary oxidation process does not show alteration in number of atoms contained in the boundary region and also has little variation in volume. Accordingly, internal distortion of the mixture region is small, thus avoiding peeling of the mixture region. Since the mixture region includes a relatively hard oxide portion and a relatively soft metal portion, for example, stress caused by variation in volume may be absorbed even when the volume is varied.

As described above, under desired annealing conditions in the embodiment of the present invention, $O_2$ contained in ambient gas or ZnO crystal does not move or is not provided onto a surface of an Ni layer and a single layer with a metal phase comprising a pure metal (Ni) (that is, Ni metal layer) 23B remains on the surface of the Ni layer.

Figure 9:
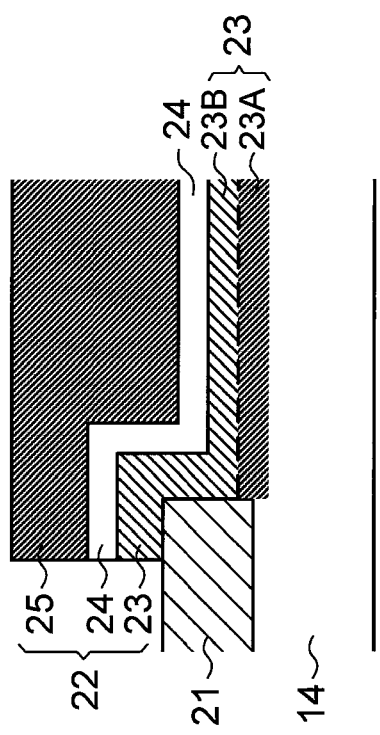
FIG. 9 is an enlarged cross-sectional view showing a contact part of a p-electrode around a boundary region W (FIG. 3C) between a ZnO-based crystal layer and a first p-electrode layer.

FIG. 9 is an enlarged cross-sectional view illustrating a contact portion of the p-side electrode 22 at the boundary portion W between the transparent electrode 21 and the p-side electrode 22 (FIG. 3C and FIG. 4B). The mixture region 23A is formed at a boundary portion between the p-type ZnO-based crystal layer 14 and the first p-electrode layer 23, while the metal layer (Ni layer) 23B remains on a surface of the first p-electrode layer 23. On the metal layer (Ni layer) 23B, the second p-electrode layer 24 as a barrier metal (i.e., Pt) and the third p-electrode layer 25 as a pad metal are formed.

According to the embodiment of the present invention, since the above-described mixture region is formed in a boundary region between the ZnO-based crystal and the electrode metal, an electrode with excellent ohmic characteristics, as well as excellent adhesion properties and high adhesion strength can be fabricated. Moreover, since a metal phase layer remains on a surface of an electrode metal layer (first layer), the fabricated electrode can exhibit excellent adhesion and bonding properties with another electrode metal layer (second layer) formed on the first electrode metal layer. In other words, the first p-electrode layer 23 has a two-phase configuration with superior adhesion to both oxide and metal, wherein the layer 23 adheres to the p-type ZnO-based crystal layer 14 as an oxide crystal and adheres to the second p-electrode layer 24 as metal.

[Conditions for Formation of the P-Side Electrode]
(Material of the First P-Electrode Layer)

It is required that a metal having capable of forming an ohmic contact with a p-type ZnO-based crystal layer should be used for the first p-electrode layer 23. According to the present invention, it is required to provide an ohmic contact between the p-type ZnO-based crystal layer and electrode metal oxide, since the metal oxide is formed between the first p-electrode layer and the p-type ZnO-based crystal layer. NiO is known as such a p-type oxide crystal. However, an oxide of the other 3d transition metal element, for example, Cu oxide including Al (aluminum), Ca (calcium), or Sr (strontium), etc. can be formed into such p-type oxide crystals. Accordingly, the first p-electrode layer may be formed using Ni or Cu, or any one alloy consisting of Ni or Cu and Al, Ca or Sr. That is, metal or metal alloys containing at least one of Ni and Cu may be used for a contact metal described above.

(Thickness of the First P-Electrode Layer)

It is preferable that the first p-electrode layer has a laminar structure and is formed with a thickness of 10 nm or more so as to thoroughly cover the ZnO-based crystal layer. The electrode layer as-deposited does not have a mixture region and an oxide crystal layer and a metal layer are merely in contact with each other. Accordingly, if a deposition layer is too thick, the deposited electrode layer is likely to be peeled off. A thickness of the first p-electrode layer is preferably 60 nm or less. More particularly, the thickness preferably ranges from 10 nm to 60 nm and, more preferably, from 10 nm to 30 nm.

(Ambient Gas for Annealing of the First P-Electrode Layer)

The present invention adopts bonding ability of readily oxidized metals (Ni, Cu, or compounds of Ni or Cu and Al, Ca or Sr) with oxygen of a constitutional element of the p-type ZnO-based crystal layer and utilizes an ambient gas for heat treatment in order to oxidize only a boundary region between the p-type ZnO-based crystal layer 14 and the first p-electrode layer 23 using oxygen provided by the p-type ZnO-based crystal layer 14, while a metal phase layer remains on a top layer of the first p-electrode layer. The heat treatment, that is, annealing is preferably conducted under an oxygen-free atmosphere or non-oxidative atmosphere. Also, a reductive gas such as hydrogen ($H_2$) may be added to the atmosphere, enabling maintenance of the top layer of the first p-electrode layer 23 in a preferable metal state.

The ambient gas for annealing the first p-electrode layer 23 used in the first embodiment was an $N_2$ gas mixture prepared by adding 3% $H_2$ gas as a reductive gas to $N_2$ gas as an inert gas. Using a reductive atmosphere containing a small amount of $H_2$ gas (>0%), a surface of the first p-electrode layer 23 is maintained in a metal state and adhesion of the p-electrode layer 23 is improved. If $H_2$ content exceeds 10%, an amount of $O_2$ discharged from the surface of the ZnO-based crystal layer is increased and a surface absorption layer is likely to be formed, thus being not preferable. Therefore, the $H_2$ gas content preferably ranges from 0.05 to 10% and, more preferably, from 0.05 to 3%.

Alternatively, instead of $N_2$ gas, other inert gases such as helium (He), argon (Ar), etc. may be used. Also, as the reductive gas, $H_2$ may be replaceable with hydrazine ($N_2H_4$) or the like. However, when using the reductive gas, a heat treatment temperature should be decreased, so as to prevent the p-type ZnO-based crystal layer from being modified or deteriorated. Heat treatment may be conducted under vacuum, however, a container used for heat treatment must be sufficiently dehydrated to remove water content from an inner wall of the container.

Conditions for formation of the first p-electrode layer 23 depend on metal used, constitutional elements of the p-type ZnO-based crystal layer 14 and composition thereof, and annealing temperature and time. Therefore, according to examinations and/or evaluations, a useful gas and conditions for formation of the electrode layer are preferably selected.

(Annealing Temperature)

If an annealing is performed at a low temperature of less than 350° C., it is difficult to form a mixed crystal layer (mixture region). On the other hand, it is not preferable to perform annealing at a high temperature of more than 500° C., since metal elements (Ni) of the first p-electrode layer 23 form a solid solution (or solid-state solution) in the ZnO-based crystal layer 14 such that mixed crystals formation extends to a surface layer of the electrode layer. Accordingly, the annealing temperature desirably ranges from 350 to 500° C. In order to prevent formation of a solid solution in a heating process in association with device mounting after manufacture, the annealing temperature more preferably ranges from 350 to 450° C.

(Material of the Second P-Electrode Layer)

In order to prevent formation of a solid solution of metal elements (Ni) of the first p-electrode layer 23 and another metal elements (i.e., Au) of the third p-electrode layer 25, the second p-electrode layer 24 is provided as a barrier metal layer between these two metal layers. The reason behind the above arrangement is that Ni of the first p-electrode layer 23 is a very thin film of 10 to 30 nm and, if Au is directly formed on the Ni layer, Ni may form a solid solution with Au due to heat added by, for example, solder bonding (at 230 to 270° C.) or an Au/Sn co-crystal process (at 300 to 350° C.).

Accordingly, the second p-electrode layer 24 is provided as a barrier layer (or barrier metal) to prevent formation of a solid solution of metals of the first p-electrode layer 23 and the third p-electrode layer 25. Examples of such metals may include rhodium (Rh), palladium (Pd), iridium (Ir), titanium (Ti), tungsten (W), and the like, other than Pt described above.

Specifically, the second p-electrode layer 25 (barrier layer) may have a multi-layered structure. For instance, it is possible to combine a metal insoluble in the first p-electrode layer 23 with another metal insoluble in the third p-electrode layer 25. The metal used for the barrier layer is generally selected from metals with high hardness. For a thick barrier layer, distortion occurs due to a difference in thermal expansion coefficients of the barrier layer and the p-type ZnO-based crystal layer when heating so that electrode peeling may develop. This problem can be prevented by forming the second p-electrode layer with a specific structure wherein a plurality of barrier layers is piled to form a laminate and a soft metal (such as Au) is interposed therebetween.

(Material of the Third P-Electrode Layer)

A material used for the third p-electrode layer 25 may be aluminum (Al) instead of Au. In general, Au is most preferably used as a bonding pad layer material, since Au is generally used as a bonding wire. On the other hand, Al is a highly reflective material that reflects even near-ultraviolet light and is thus suitable for suppressing light absorption by an electrode.

(Timing of Annealing Process)

According to the first embodiment of the present invention, an annealing process to form a mixture region was performed after forming the first p-electrode layer 23. Such annealing may be performed after formation of the second p-electrode layer 24 (barrier layer) or the third p-electrode layer 25 (pad electrode layer).

However, the bonding state of crystal is varied according to movement (diffusion) of oxygen atoms during formation of the mixture region, causing significant spatial distortion. Accordingly, where the annealing is performed after formation of the first p-electrode layer 23, deterioration in adhesion and/or bonding strength of the mixture region is not caused since the metal layer is thin and spatial distortion is easily relaxed. Therefore, the annealing process performed after deposition of the first p-electrode layer 23 is most effective, compared to where the annealing process is performed after formation of the second p-electrode layer 24 or the third p-electrode layer 25.

Second Embodiment

Figures 10A, 10B:
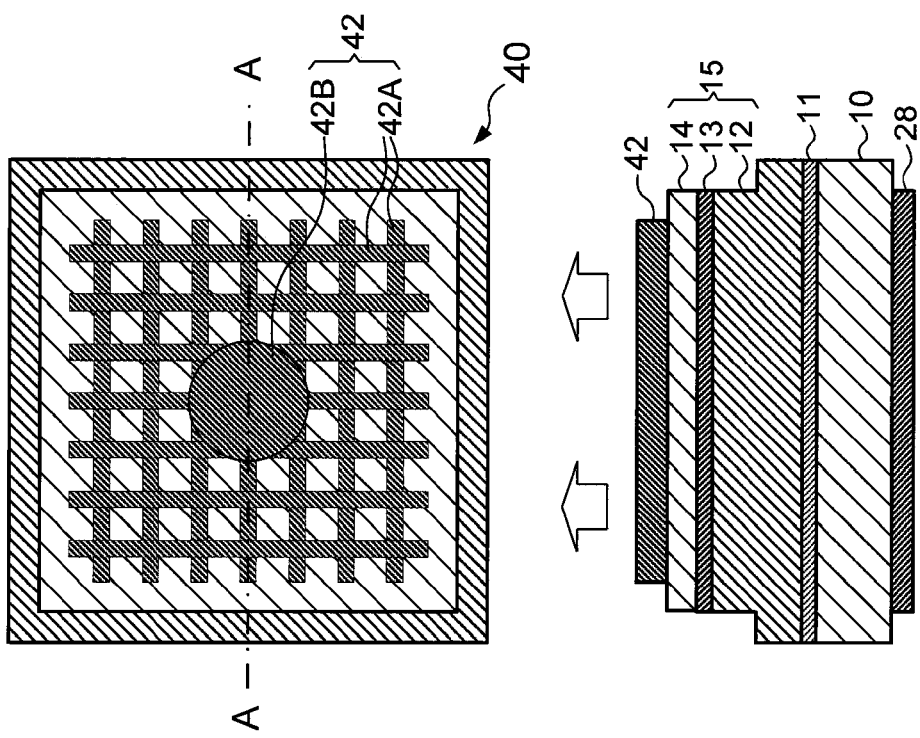
FIGS. 10A and 10B are a top view and a cross-sectional view taken along the line A-A in the top view, showing an LED device according to a second embodiment of the present invention.

FIGS. 10A and 10B are a top view and a cross-sectional view taken along the line A-A of the top view, respectively, showing an LED device 40 fabricated according to a second embodiment of the present invention.

The configuration of the LED device 40 according to the second embodiment (Second Embodiment) is substantially the same as the LED device 30 of the first embodiment of the present invention, in terms of configurations, except that a mesh shape electrode structure is adopted. That is, a buffer layer 11, an n-type ZnO-based crystal layer 12, a light emitting layer 13 and a p-type ZnO-based crystal layer 14 were arranged on a ZnO substrate 10, so as to form a device layer 15.

Using a device-layer-formed substrate formed as described above, the p-side electrode 42 was formed on the p-type ZnO-based crystal layer 14. The p-side electrode 42 includes a mesh-shape p-side electrode 42A and a circular-shape p-side electrode 42B (with a diameter of 100 μm) for wire bonding, which was placed in the center of a device. As shown in FIG. 11, the p-side electrode 42 includes first, second and third p-electrode layers 43, 44 and 45.

Hereinafter, a forming process of a p-side electrode 42 is described in detail below. Using photolithographic techniques, a resist mask having an opening corresponding to a mesh-shape p-side electrode 42A and a circular p-side electrode 42B was formed on a p-type ZnO-based crystal layer 14 and Ni was deposited to a thickness of 30 nm thereon by EB deposition. Subsequently, the Ni portion except for the mask opening was removed by a lift-off method.

Next, a substrate was set in an RTA apparatus and $N_2$ gas containing 3% $H_2$ gas as an ambient gas was supplied to the apparatus in order to conduct annealing at 400° C. for 10 seconds under a reductive atmosphere. As a result, a first p-electrode 43 was formed. More particularly, the first p-electrode layer 43 was formed according to the same procedures described in the first embodiment wherein a mixture region MR 43A was formed by annealing at a boundary IF between the p-type ZnO-based crystal layer 14 and the deposited Ni layer, while a pure metal layer (Ni layer) 43B remains on a surface of the first p-electrode layer 43.

Then, using EB deposition, Pt and Au were deposited to thicknesses of 100 nm and 1000 nm, respectively, so as to form a second p-electrode layer 44 and a third p-electrode layer 45.

After formation of the p-side electrode 42, a back side of the device-layer-formed substrate 17 was polished and an n-side electrode 28 was formed. The device-layer-formed substrate 17, after formation of the n-side electrode 28, was divided into separate LED devices by scribing and breaking.

As described in the first embodiment of the present invention, the mixture region is formed at the boundary between the p-type ZnO-based crystal layer 14 and the p-side electrode 42 and a metal phase layer (Ni layer) remains on a surface of the first p-electrode layer 43, so that excellent ohmic characteristics, high electrode adhesion properties and bonding strength can be achieved. According to the second embodiment of the present invention, an electrode with improved low resistance ohmic characteristics can be provided since the mesh-shape p-side electrode 42 is formed over a light emitting plane. Since current injected from the p-side electrode 42B is diffused throughout a light emitting layer 13, a light emitting device having uniform current injection and high efficiency can be provided. In addition, electrode adhesion properties and bonding strength can be improved. A width of each line of the mesh-shape electrode may be desirably defined in consideration of (external) light emission efficiency, contact resistance, electrode adhesion strength, etc.

Third Embodiment

FIGS. 12A and 12B are a top view and a cross-sectional view taken along the line A-A of the top view, respectively, showing an LED device fabricated according to a third embodiment of the present invention.

An LED device 50 according to the third embodiment (Third Embodiment) has substantially the same configuration as the LED device 30 fabricated in the first embodiment, except that a flip-chip structure using an n-side electrode side as a light emitting plane and a light reflection structure are adopted. That is, a device layer 15 comprising a buffer layer 11, an n-type ZnO-based crystal layer 12, a light emitting layer 13 and a p-type ZnO-based crystal 14 was formed on a ZnO substrate 10.

The device-layer-formed substrate was used and a p-side electrode 52 was formed on the p-type ZnO-based crystal layer 14. A device partition size is identical to that described in the first embodiment (see FIG. 4) and, as shown in FIG. 12, the p-side electrode 52 was formed in a square shape having sides of 270 μm (D3), which is about 15 μm smaller than a size of a square device partition having sides of D2 (300 μm).

Figure 13:
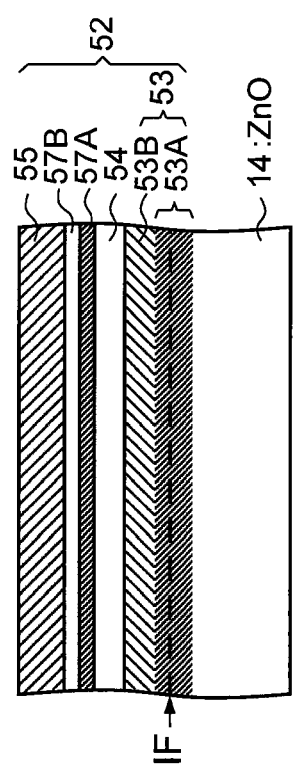
FIG. 13 is an enlarged cross-sectional view schematically showing a configuration of a p-electrode in the LED device according to the third embodiment.

FIG. 13 is a cross-sectional view showing a configuration of the p-electrode 52. The p-side electrode 52 has a configuration including: first, second and third p-electrode layers 53, 54 and 55; and a reflection layer 57A and a reflection-protecting layer 57B which are formed between the second and third p-electrode layers 54 and 55. More particularly, the reflection layer 57A made of a highly reflective metal such as silver (Ag) is formed on the second electrode layer 54 in order to reflect light emitted from the light emitting layer 13, and the protecting layer 57B made of barrier metal (e.g., Pt) is formed between the reflection layer 57A and the third p-electrode layer 55.

For example, the second p-electrode layer 54, the reflection layer 57A, the protecting layer 57B and the third p-electrode layer 55 (pad electrode) were laminated in sequential order to form Rh/Ag/Rh/Au layers with thicknesses of 30 nm/100 nm/60 nm/1000 nm, respectively, thus completing a p-side electrode. The reflection layer 57A may be formed using Al, Rh, etc. with high reflectivity, other than Ag. Since Rh serves as a barrier layer, using Rh as the second p-electrode layer (barrier layer) enables simple configuration of a laminate structure.

According to the third embodiment of the present invention, similar to the first embodiment and the second embodiment, Ni used as the first p-electrode layer 53 was deposited to a thickness of 30 nm and annealed at 400° C. for 10 seconds under a reductive atmosphere, and the second p-electrode layer 54 was formed after annealing. Therefore, the first p-electrode layer 53 was formed according to the same procedures described in the first embodiment and the second embodiment wherein a mixture region 53A was formed by annealing at a boundary region between the p-type ZnO-based crystal layer 14 and the deposited Ni layer, while maintaining a pure metal layer (Ni layer) 53B on a surface of the first p-electrode layer 53.

After formation of the p-side electrode 52, the device-layer-formed substrate 17 was polished and an n-side electrode 58 was formed. The completed substrate 17 after forming the n-side electrode 58 was divided into separate LEDs by scribing and breaking.

According to the third embodiment, since the p-side electrode 52 is formed on the entire surface of the p-type ZnO-based crystal layer 14, an electrode with further low resistance ohmic characteristics can be achieved. Since current injected into the p-side electrode 52 is diffused throughout a light emitting layer 13, a light emitting device having uniform current injection and high light emission efficiency can be provided. In addition, electrode adhesion properties and bonding strength can be improved.

Although the above-described embodiments described in detail an LED as an illustrative example of a semiconductor light emitting device, the present invention may also be applied to other semiconductor devices such as a semiconductor laser and other electronic devices.

Furthermore, the foregoing exemplary embodiments may also be used as a combination thereof. For example, in the first embodiment and the second embodiment, a reflection layer and a protecting layer may be formed between the second p-electrode layer and the third p-electrode layer.

As described above, the present invention can provide a method for forming a contact electrode with excellent ohmic characteristics as well as high electrode adhesion properties and bonding strength, a ZnO-based compound semiconductor device having the contact electrode and a method for manufacturing the same.

The invention has been described with reference to the preferred embodiments thereof. It should be understood by those skilled in the art that a variety of alterations and modifications may be made from the embodiments described above. It is therefore contemplated that the appended claims encompass all such alterations and modifications.

This application is based on Japanese Patent Application P2009-096486 which is hereby incorporated by reference.

What is claimed is:

1. A method for forming a contact electrode for a p-type ZnO-based semiconductor, comprising:
   (A) forming a doped p-type $Mg_xZn_{(1-x)}O$ layer, wherein 0<x<0.43, as an uppermost layer of the p-type ZnO-based semiconductor layer;
   (B) forming a contact metal layer on the doped p-type $Mg_xZn_{(1-x)}O$ layer to form a first p-electrode layer, wherein the contact metal layer contains at least one of Ni and Cu, and has a thickness of 60 nm or less;
   (C) forming a barrier metal layer directly on the contact metal layer to form a second p-electrode layer;
   (D) forming a pad metal layer on the barrier metal layer to form a third p-electrode layer; and
   (E) performing a heat treatment, after steps (B), to form a mixture region of the doped p-type $Mg_xZn_{(1-x)}O$ layer and the contact metal layer, wherein the heat treatment is performed under a reductive gas atmosphere containing $H_2$ and at a temperature in the range of 350 to 450° C. to change the contact metal layer into an oxide layer at the interface of the contact metal layer and the doped p-type $Mg_xZn_{(1-x)}O$ layer, while maintaining a metal phase layer of the contact metal layer on the side of the second p-electrode layer.

2. A method of manufacturing a zinc oxide (ZnO) based semiconductor device comprising a p-type ZnO-based semiconductor layer, comprising:
   (A) forming a doped p-type $Mg_xZn_{(1-x)}O$ layer, wherein 0≤x<0.43, as an uppermost layer of the p-type ZnO-based semiconductor layer;
   (B) forming a contact metal layer on the doped p-type $Mg_xZn_{(1-x)}O$ layer to form a first p-electrode layer, wherein the contact metal layer contains at least one of nickel (Ni) and copper (Cu), and has a thickness of 60 nm or less;
   (C) forming a barrier metal layer directly on the contact metal layer to form a second p-electrode layer;
   (D) forming a pad metal layer on the barrier metal layer to from a third p-electrode layer; and
   (E) performing a heat treatment, after steps (B), (C) or (D), to form a mixture region of the doped p-type $Mg_xZn_{(1-x)}O$ layer and the contact metal layer,
   wherein the heat treatment is performed under a reductive gas atmosphere containing $H_2$ and at a temperature in the range of 350 to 450° C. to change the contact metal layer into an oxide layer at the interface of the contact metal layer and the doped p-type $Mg_xZn_{(1-x)}O$ layer, while maintaining a metal phase layer of the contact metal layer on the side of the second p-electrode layer.

3. The method according to claim 2, wherein the heat treatment is performed between steps (B) and (C).

4. The method according to claim 2, wherein a thickness of the contact metal layer is in the range of 3 nm to 30 nm.

5. The method according to claim 2, wherein the barrier metal layer comprises at least one of platinum (Pt), rhodium (Rh), palladium (Pd), iridium (Ir), titanium (Ti) and tungsten (W).

6. The method according to claim 2, wherein the ZnO-based semiconductor device is a light emitting diode (LED) including an n-type ZnO-based semiconductor layer and a light emitting layer.

7. The method according to claim 2, further comprising:
   forming between steps (A) and (B) a light transmissive electrode,
   wherein part of the first p-electrode layer formed in step (B) extends over the light transmissive electrode.

8. The method according to claim 2, wherein the first p-electrode layer, the second p-electrode layer and the third p-electrode layer each have a mesh-shape, and are formed over a light emitting plane.

9. The method according to claim 2, further comprising forming between steps (C) and (D), a metal reflection layer.

10. The method according to claim 9, wherein the contact metal layer has a thickness in the range of 3 nm to 30 nm.

11. The method according to claim 10, wherein the ZnO-based semiconductor device is a light emitting diode (LED), including an n-type ZnO-based semiconductor layer and a light emitting layer.

12. The method according to claim 11, wherein the barrier metal layer comprises at least one metal selected from the group consisting of platinum (Pt), rhodium (Rh), palladium (Pd), iridium (Ir), titanium (Ti) and tungsten (W).

13. The method according to claim 7, wherein the contact metal layer has a thickness in the range of 3 nm to 30 nm.

14. The method according to claim 13, wherein the ZnO-based semiconductor device is a light emitting diode (LED), including an n-type ZnO-based semiconductor layer and a light emitting layer.

15. The method according to claim 8, wherein the contact metal layer has a thickness in the range of 3 nm to 30 nm.

16. The method according to claim 15, wherein the ZnO-based semiconductor device is a light emitting diode (LED), including an n-type ZnO-based semiconductor layer and a light emitting layer.

* * * * *